(12) United States Patent
Curry et al.

(10) Patent No.: US 9,773,274 B2
(45) Date of Patent: Sep. 26, 2017

(54) SYSTEM AND METHOD FOR ONLINE VIRTUAL FITTING ROOM

(71) Applicants: Scott William Curry, Monrovia, CA (US); Luis Antonio Sosa, Los Angeles, CA (US)

(72) Inventors: Scott William Curry, Monrovia, CA (US); Luis Antonio Sosa, Los Angeles, CA (US)

( * ) Notice: Subject to any disclaimer, the term of this patent is extended or adjusted under 35 U.S.C. 154(b) by 95 days.

(21) Appl. No.: 14/558,715

(22) Filed: Dec. 2, 2014

(65) Prior Publication Data
US 2015/0154691 A1 Jun. 4, 2015

Related U.S. Application Data

(60) Provisional application No. 61/910,691, filed on Dec. 2, 2013.

(51) Int. Cl.
*G06Q 30/00* (2012.01)
*G06F 17/30* (2006.01)
(Continued)

(52) U.S. Cl.
CPC ..... *G06Q 30/0643* (2013.01); *G06F 17/5018* (2013.01); *G06Q 30/0631* (2013.01); *G06T 13/40* (2013.01)

(58) Field of Classification Search
None
See application file for complete search history.

(56) References Cited

U.S. PATENT DOCUMENTS 5,495,568 A   2/1996   Beavin
5,530,652 A   6/1996   Croyle et al.
(Continued)

FOREIGN PATENT DOCUMENTS

FR   WO 2012123346 A2 *   9/2012   ............. G06T 17/00
GB   WO 2012110828 A1 *   8/2012   ............ G06T 19/006

OTHER PUBLICATIONS

Decaudin et al, "Virtual Garments: A Fully Geometric Approach for Clothing Design" Eurographics 2006, vol. 25, No. 3, Sep. 2006.*

*Primary Examiner* — William Allen
*Assistant Examiner* — Matthew Todd
(74) *Attorney, Agent, or Firm* — Baker, Donelson, PC; Royal W. Craig

(57) ABSTRACT

A system and method for virtually fitting an article of clothing on an accurate representation of a user's body obtained by 3D scanning of the user in minimal clothing and in standard garments of known properties. A graphical user interface allows the user to access a database of garments and accessories available for selection for the virtual fitting simulation for which each garment's physical and material properties are known. A finite element analysis is applied to determine the shape of the combined user body and garment and a an accurate visual representation of the selected garment or accessory on the proportional model of the user's body based on the analysis is generated. Means are also provided for the user to solicit custom garments or accessories from a participating designer or retailer, purchase selected garments or accessories from the participating designer or retailer, and communicate his or her preferences with participating designers, retailers, or other users.

11 Claims, 12 Drawing Sheets

(51) Int. Cl.
  *G06Q 30/06* (2012.01)
  *G06T 13/40* (2011.01)
  *G06F 17/50* (2006.01)

(56) References Cited

U.S. PATENT DOCUMENTS

| | | | |
|---|---|---|---|
| 5,557,527 A | 9/1996 | Kotaki et al. | |
| 6,546,309 B1* | 4/2003 | Gazzuolo | G06Q 30/0601 |
| | | | 33/512 |
| 8,189,000 B2 | 5/2012 | Weaver | |
| 8,525,828 B1* | 9/2013 | Bates | G06T 17/00 |
| | | | 345/419 |
| 2011/0298897 A1* | 12/2011 | Sareen | G06N 3/006 |
| | | | 348/47 |
| 2013/0215116 A1* | 8/2013 | Siddique | G06Q 30/0643 |
| | | | 345/420 |

* cited by examiner

- Sign On / Password
  - Create a USGA Profile
    - Modify User/Body Profile
      - Modify Body Profile (modifying body attributes) - select / alternative name / save
  - Create or Modify an Existing Garment Profile
    - Search Product Catalog (multiple criteria available for searching: yes/no - USGA profile) - search / show deviations / select-views-attributes / alternative name / save
    - Modify Garment Profile
      - Modifying Garment Profile Attributes - select /modification options / alternative name / save
      - Modifying Garment Profile Mfg. Specifications - select /modification options / alternative name / save
      - Viewing Garment Options - select / choose option
    - Layer Garments - select / layer / choose options / alternative name / save
  - Create a Garment Profile
    - Import/Export USGA Profiles - select / alternative name / save
    - Import Fabric Photo - select / alternative name / save
    - Import or Input Fabric Characteristics - select / alternative name / save.
    - Import or Input Garment General Information - select / alternative name / save
    - Import or Input Garment Specifications - select / alternative name / save
    - Import or Input Garment Pattern - select / alternative name / save
    - Run Garment Simulation (modifying garment attributes) - adjust attributed / alternative name / save
    - Add to Product Catalog - designate/ add general product information / alternative name / save

Fig. 1

☐ Create or Modify an Existing Locational Profile
  ☐ Search Available Locations (multiple criteria available for searching) - select / alternative name / save
  ☐ Modify Locational Profile (modifying garment attributes) - select / alternative name / save
  ☐ Import/Export Personalized Locational Profiles (multiple criteria available for searching) - select / alternative name / save ☐ Create or Modify an Existing USGA Profile
  ☐ Designate Simulation Criteria - USGA name / project - yes/no / general information / start
    ☐ Update Body Profile - import
    ☐ Update Garment Profile(s) - import (to be used in this simulation) / select / import
    ☐ Update Locational Profile(s) - import (to be used in this simulation) / select / import
  ☐ Run Simulation
    ☐ Modify Body Profile Attributed - select options / save
    ☐ Modify Garment Profile - select options / save
    ☐ Modify Locational Profile - select options / save
  ☐ Save USGA Profile ☐ Create a Project
  ☐ Create or Modify Existing Products - project ID / general information / yes/no options / member designations / save ☐ Modified User Profile
  ☐ Modify Personal Profile - ID/password / general information / yes/no options / save

Fig. 1 (cont.)

Summary Description of Data Flows (Detailed Define in body of document)

1. INPUT - Personal Profile (Mathematical Image)
2. INPUT - Body Profile
3. INPUT - Apparel Profile (Mathematical Image)
4. INPUT - USGAL Relationship (Mathematical Image)
5. INPUT – Creating a Project
6. INPUT – Location Images
7. MODIFACTION – Creating a USGAL Relationship (Mathematical Images)
8. INPUT – Supplier Accessories
9. INPUT – Supplier Advertisements
10. OUTPUT – Location Images
11. OUTPUT – Marketing Data
12. OUTPUT – USGAL Relationship & Manufacturing Spec (Math'l Image)
13. OUTPUT – Sales Order with Supplier

Fig. 3 (cont.)

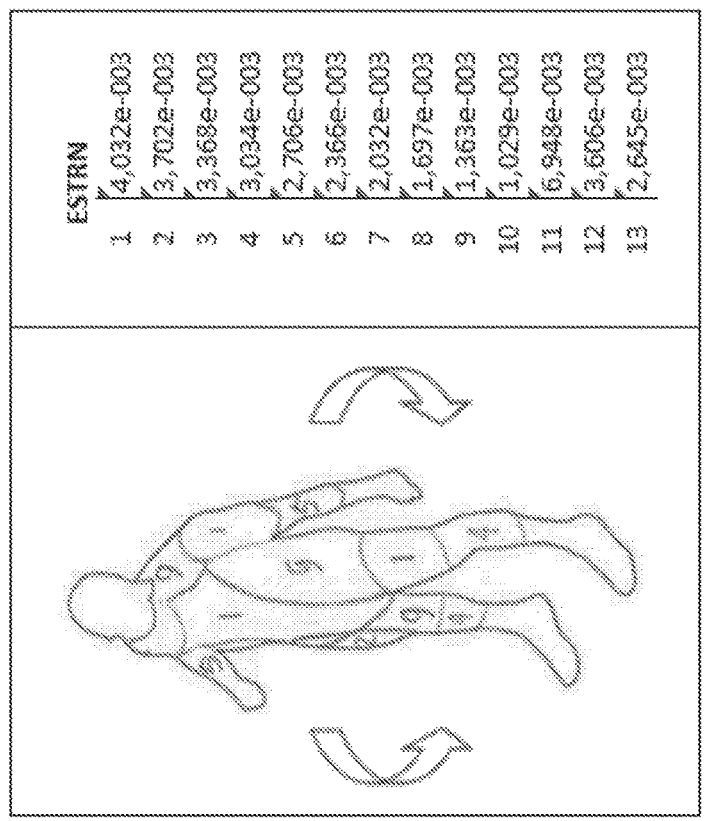
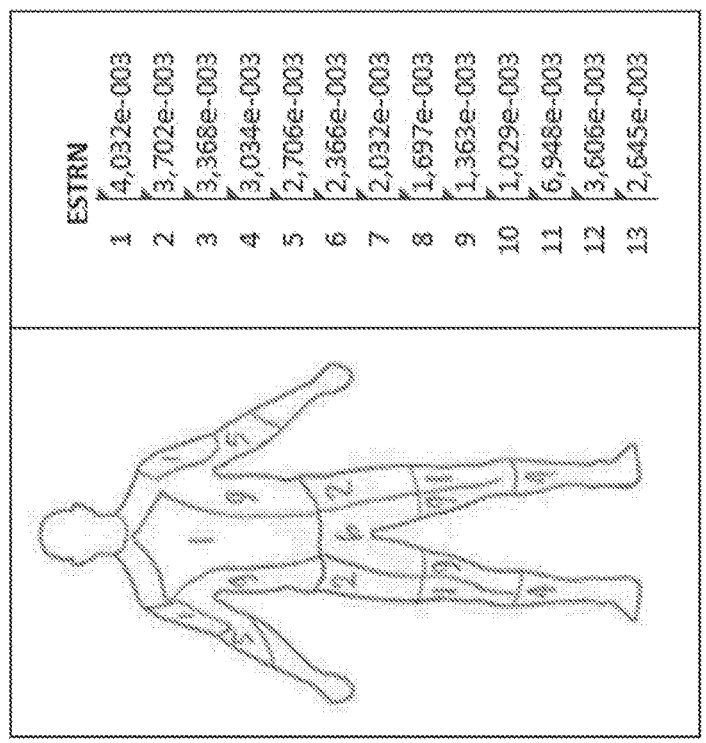
Fig. 8

SYSTEM AND METHOD FOR ONLINE VIRTUAL FITTING ROOM

CROSS REFERENCE TO RELATED APPLICATIONS

This patent application claims priority to U.S. Provisional Patent Application No. 61/910,691 filed on Dec. 2, 2013 and titled "System and Method For Online Virtual Fitting Room," which is here incorporated in its entirety by reference.

BACKGROUND OF THE INVENTION

1. Field of the Invention

The present invention relates generally to the field of virtual three-dimensional modeling of garment fit and more specifically to a system and method of predicting and visually representing to a user the fit and appearance of one or more garments if worn by that user based on the physical attributes of the garment or garments and simulation of the interaction between the garment or garments and the user's body.

2. Description of the Background

There are many documented methods of defining attributes for how a customer could view and select an article of clothing in a 3D virtual environment. One such method is to select a garment of a predetermined size and then overlaying a two-dimensional (2D) or 3D image of the selected garment onto a 2D or 3D image representing the subject wearer, thus presenting an image of a virtual fitting. This method provides the user with the ability to visually compare and contrast selections of garments, but does not take into account the nature and reaction of the fabric chosen with the user's individual body type and shape, nor does it allow the user to view 360 degree image of him or her self in the garment. Consequently, this method of viewing garments in a virtual environment does not provide an accurate, "true fit" representation of how the selected garment would look on the actual shopper. Instead, such prior art systems show a representation of the clothing as virtually "worn" by a generic human form, a photograph of the garment on the body of a fashion model that usually does not accurately represent the size, shape, or other features of the actual shopper's body, or simply a photograph of the garment in isolation. Such systems are not particularly helpful in determining how a particular article will look when actually applied to the body of a typical customer who does not have the proportions of a fashion model nor of the 3D, virtual "mannequin" chosen by the clothing retailer. As fit is an important factor in the decision making process for the typical customer when shopping for clothing or other apparel, the absence of a "true fit" experience for online shoppers is a major drawback that increases the rate at which customers are unsatisfied with their clothing purchase and/or decide to return their purchased articles to the retailer. These conditions are detrimental to both the consumer, who is either unsatisfied or must endure the hassle, return shipping, and other costs of returning the garment, and to the retailer, who loses money when articles are returned or loses business from unsatisfied customers.

For example, U.S. Pat. No. 8,189,000 to Weaver discloses a system and method comprising creating a 3D, personalized mannequin of the user and allowing the user to apply images representing different sizes of available garments to the mannequin so that the user can visualize what these selections would look like from different angles in a virtual dressing room. The Weaver '000 system allows minor, "proportion selection" modifications to the mannequin, but does not allow the user to personalize his or her profile outside of these standard modification settings. The Weaver '000 system also does not allow the user to act as a garment and/or virtual mannequin designer.

Similarly, US Patent Application Publication No. 20110298897 to Sareen et at relies on measured and assumed values and a comparative linear regression algorithm to provide a simple superimposition of the garment onto the user profile. The system and method disclosed by Sareen '897 does not provide the user the ability to design or modify existing garment and/or virtual mannequin designs to create a user specific profile.

U.S. Pat. No. 5,557,527 to Kotaki et al, discloses a method of designing knit fabrics. However, Kotaki '527 does not mathematically or visually represent an accurate profile of the user's body, nor does it allow the user to design or modify an existing garment and/or virtual mannequin design to create a user specific profile.

U.S. Pat. No. 5,530,652 to Croyle et al. discloses an automatic garment inspection and measurement system, but does not provide the user with an actual visual representation of how the garment would look on the individual user, or with another garment or accessory layered on top of it. Croyle '652 also does not provide the ability for the user to design or modify existing garment and/or virtual mannequin designs to create a user specific profile.

U.S. Pat. No. 5,495,568 to Beavin does not provide an accurate representation of the user onto which a garment may be fit, in that it does not incorporate the space in-between an accurate representation of the user's body and the garment, nor does it incorporate the fabric characteristics and/or layering of garments, into this representation. This method also does not provide the ability for the user to design or modify existing garment and/or mannequin designs to create a user specific profile.

Overall, the prior art does not provide a method for providing a "true form fit" experience for the user, or a means for a user to design or customize his or her own user profile to observe a depiction of him or herself wearing a selected article of clothing, while moving freely within a three dimensional space having a customizable background setting. Nor does the prior art provide a method of viewing a virtual representation of a selected garment on a specific user that is capable of accounting for realistic garment material deformation that would occur as the garment(s) is(are) actually worn by the user. Moreover, none of the methods described above allows the user to create the specifications for a custom tailored garment, but rather focus on selections of existing sizes of garments from a category for viewing on a standard, non-user specific mannequin depiction.

What is needed is a system and method capable of capturing the correct, physical, customer, and garment material-specific properties necessary to perform a finite element analysis to create a 100% accurate calculation of the deflection and forces operating on a given garment or accessory when worn by a particular user, such that the user may observe a true virtual fit of that garment or accessory as it would appear on his or her own body in an environment of the user's choosing.

SUMMARY OF THE INVENTION

According to the present invention, there is provided a system and method for 3D measurement and construction of a virtual model of the user's actual body of sufficient accuracy for use in performing a finite element analysis of the fit of one or more garments or accessories on a virtual representation of a user's actual body to achieve a 100% accurate or near 100% accurate prediction of the visual appearance of the garment(s) or accessories when worn by the user. The instant invention provides the user with the ability to virtually design and/or try on clothing within a pre-defined or user created environment or Locational Profile. The instant invention includes creating a 3D scan of a user using a 3D modeling software system and one of any number of 3D solid body surface scanning systems based on infrared, millimeter wave, laser or other technology to capture the shape and firm of the body while at the same time capturing photographs of the body.

Scans of the individual are preferably obtained of the user's body in both a "baseline" condition, i.e. with no or minimal clothing, and for the user's body when wearing a variety of "standard" clothing articles of different types having known dimensions and properties and, in some instance, each having the user's desired "fit" characteristics on the user's body. Additionally, scans are preferably obtained, for the use in both a stationary, standing pose as well as various other "body distorted" positions such as seated, inhaled, exhaled, kneeling, etc. This set of additional scans enables the system to create both a Body Profile for the user's "baseline" body shape, and one or more Space Profiles corresponding, to the one or more "standard" articles of clothing worn by the user in the scans to describe the space between the user's body and those various articles to allow the system to depict a more accurate "fit" of additional garments selected by the user for simulation The method according to the present invention further comprises collecting one or more Garment or Accessory Profiles describing the physical and material properties of various garments or clothing accessories. This information is collected either from a clothing/accessory designer, manufacturer, supplier, retailer, etc., from examination and testing of exemplary articles or is based on the user's own design. Garment or Accessory Profiles housed in an electronic database then function as a "product catalog" which the user may search to identify garments and/or accessories to have the system simulate on his or her Body Profile for an accurate representation of those articles as they would actually be worn by the user. The system of the present invention also aids the user in selecting garments or accessories by illustrating where the chosen garment or accessory deviates from a garment or accessory of ideal fit to the user by, i.e., showing the user where the garment or accessory is too tight or too loose for the user's specific proportions as set forth in his or her Body Profile. In addition, where a garment does not fit properly the system may show the user other garment or accessory options that are available from the designer or manufacturer of the selected garment/accessory.

A system according to the present invention may also provide the user with the ability to submit a design change request a designer or manufacturer who has garments listed in the present invention's "product catalog." The invention thus engenders a relationship between the user and industry professionals, which provides an entirely new online shopping experience to the user and an online retail experience for the garment seller wherein tailored products are more accessible to individual consumers and designers and/or manufactures obtain marketing information directly from a potential customer. In addition, the present invention allows designers and/or manufacturers to market directly to unique groups of potential customers, characterized by similar demographics or product preference data or the like.

The system according to the present invention employs a finite element analysis and photo realistic rendering to provide a virtual image of the user's own body wearing a selected garment or accessory that is similar to the experience of looking in a mirror in a retail changing room or of a third-party photograph of the user wearing the garments. The rendering depicts the selected garment with precise exact contoured fit as it would appear on the user's own body rather than on a "generic" model. The use is also provided the ability to rotate and/or move his or her viewpoint relative to the body profile rendering to view the garment-body relationship from any location or angle in a 3D space and allows the user to select from or customize a background image to better assess the body/garment relationship as it would look in a specific, selected environment.

The present invention generates a detailed mathematical and visual measurement and representation of a human user's body in various positions or poses, physically and materially defines a full spectrum of garment items and their individual relationships to the space between the garment and the user's body, a full spectrum of clothing accessory selections, and a customizable location background image or video in order to provide a user with an accurate, visual representation of the way that selected garments and/or accessories would look, move, and react when worn by the user him or her self in the specified environment without the necessity for the user to actually try on the garment(s) and/or accessories in a physical clothing store. The Body Profile, the Garment Profile, the Space Profile, one or more Accessory Profiles, and the Locational Profile are combined into a relational profile, the User Space Garment Profile Accessory Selection and Locational Background Profile (US-GAL), that can be shared with other users, designers, retailers, apparel manufacturers, or other panics of the user's choosing in order to add further customization to the process of designing and ordering garment and accessory items in a virtual environment such as an online shopping mall.

Definitions of Key Terms

3D Cad Rendering: The 3D computer graphics process of automatically convening 3D wire frame models into 2D images with 3D photorealistic effects on a computer.

3D Scanning/Scanner: A method/device that analyzes a real-world object or environment to collect data on its shape and possibly its appearance. The collected data can then be used to construct digital, three dimensional models.

Accessory Profile: The 3D image of an accessory that can be added to the User Specific Garment Profile (USGAL). An accessory may comprise a scarf, hat, pair of shoes, pair of nylons, socks, purse and the like. These profiles may be selected, moved within the locational profile and saved.

Active Iterating: The process of applying a function repeatedly, using the output from one iteration as the input to the next. The process may also include some degree of customization/modification of the output before the next iteration to produce a greater degree of output accuracy or optimal design.

Bioelectrical Impedance Analysis (BIA): A technique which uses the resistance electrical flow through the body to estimate body fat.

Both Mass Index (BMI) or Quetelet Index: A measure for human body shape based on an individual's mass and height. It is defined as the individual's body mass divided by the square of their height—with the value universally being given units of $kg/m^2$.

Body Profile: A 100% accurate exterior representation of the human body. The measurements of this profile include measurements of the individual inhaling, exhaling, standing, kneeling, sitting, etc. to establish the variables of adjustment or movement attributes that the individual experiences during actual movement. The user/body profile also includes a pixel to center point relationship to accurately layer the visual characteristics to the body's measurements. Example measurements include skin color, eye color, hair length and color, etc.

DXA: A means of measuring bone mineral density (BMD). The DXA can also be used to measure total body composition and fat content with a high degree of accuracy.

Finite Element Analysis (FEA): A numerical technique for finding approximate solutions to boundary value problems by breaking down a real object into a large number (thousands to hundreds of thousands) of finite elements, such as little cubes, and then using mathematical equations to predict the behavior of each finite element. Then, the behaviors of each individual finite element are compiled by a computer to predict the behavior of the actual object. Thus, FEA is a computerized method for predicting how a product reacts to real-world forces, such as vibration, heat, fluid flow, and other physical effects; i.e., how the product will react during use. A FEA shows whether a product will break, wear out, or work the way it was designed under the various conditions imposed. FEA is often used in the product development process.

Garment Profile: The Garment Profile comprises: (1) an 100% accurate measurement a garment; and (2) the texture variation measurements of that garment. Engineering properties, characteristics and principles are incorporated into a finite element analysis model to measure characteristics of the fabric of each garment, including, but not limited to, stress, strain, deformation, reflection, twist, turn, expansion, friction, resistance, static fiction and drag coefficient. The Garment Profile also comprises: (3) a pixel to center point relationship to accurately layer the visual characteristics to the garment measurements; (4) predefined scripts attached to the texture measurement to provide showing, movement and the like; and (5) all possible modifications to the standard selection.

Hydrostatic weighing: A technique for measuring the mass per unit volume of a user's body. From this density information, body composition and percentage body fat may be estimated, using the Siri or Brozek formula.

IModel: A virtual fitting room interaction platform or store front where the user/customer can access, select, make modifications to virtual garment selections, and correspond with other users.

Linear Finite Element Analysis: A method of analysis that can be used when a structure is expected to behave linearly, i.e. obeys Hook's Law. This model assumes that stress is proportional to the strain, and the object will return to its original configuration once the load has been removed.

Locational Profile: A 2D or 3D image of background or multiple backgrounds to provide the user with a 3D environment of their choice for presentation purposes or to view what a garment would look like in a specific setting. This 3D environment allows the USGAL profile to rotate, change positions and to move freely anywhere within the 3D space. The background moves in concert with the USGAL profile even when the virtual viewpoint changes distances towards and away from the USGAL profile.

Mask: A process of eliminating and/or smoothing actual detailed body features from the visual of the User/Body Profile. This feature be used for sharing of a user's USGAL profiles publicly or among other users.

Non-Linear Finite Element Analysis: A method of analysis that is used to predict the behavior of an object that is loaded beyond the elastic limits of the subject material. This model is used with the subject object experiences plastic deformation and will not return to its original configuration or shape.

NURBS (Non-Uniform Rational Basis Spline): A mathematical model commonly used in computer graphics for generating and representing curves and surfaces.

Simulation: An FEA simulation is a computerized 3D representation of the FEA solution, often in the form of a color scheme, visual deflection, or other numerical and graphical values.

Solid Modeling: A consistent set of principles for mathematical and computer modeling of three-dimensional solids.

Space Profile: A set of values comprising the measurements and measurement variations between the standard and/or modified Garment profile and the User/Body Profile.

User Space Garment Profile Accessory Selection and Locational Background (USGAL) Profile: A data set comprising the combination of relationships between the five listed attributes plus all modification from the initial standard selections applied to the user or body profile. Space refers to the modified space between the body and the selected garment.

Variation Measurements: Measurement values indicating the elasticity elements of a specific fabric selection.

Virtual Realistic CGI: A process of generating an image from a model, by means of a computer program. A scene file contains objects in a strictly defined language or data structure; it would contain geometry, viewpoints, texture, lighting, and shading information as a description of the virtual scene.

BRIEF DESCRIPTION OF THE DRAWINGS

Throughout the drawings, reference numbers are re-used to indicate correspondence between referenced elements. The drawings are provided to illustrate embodiments of the inventions described herein and not to limit the scope thereof.

FIG. 1 is a summary schematic illustration of user options for management of his or her user profile or to create a simulation according to the present invention.

FIG. 8 illustrates the result of a simulation of a garment on a user's avatar.

DETAILED DESCRIPTION OF THE PREFERRED EMBODIMENTS

The present invention provides a system and method for accurate virtual fitting of one or more garments or accessories onto a user-specific virtual human model, implemented via a data processing system comprising at least one application server coupled to a secure database management system and accessible to individual users via remote workstations or other electronic devices connected to said to the system via a communications network such as the Internet. The remote workstation through which a user may access the present invention may be any computing device capable of accessing the proper communications network and containing a screen capable of displaying the GUI created by the present invention for simulation of a virtual fitting environment.

According to the present invention, finite element analysis of garment-to-wearer interaction based on material properties and garment dimensions as well as 3D scanned customer model and customer body composition is coupe with photorealistic computer generated imagery is used to provide the customer with the most realistic virtual experience of the process of being fitted with apparel items. The true form fit experience can be achieved virtually based on the use and combination of 3D scanning, measuring the user's BMI, 3D Cad rendering, linear and nonlinear Finite Element Analysis, active iterating, and virtual realistic CGI. Personalized USGAL profiles can be generated for a user based on a virtual model created specifically for each individual user, as explained in more detail below. Process and cost improvements, for both the user/customer and apparel retailer, designer, or manufacturer gained by using the method according to the present invention include: (1) Establishing a data sharing relationship between the customer and the designer, retailer or manufacturer to standardize the dialog and ensure more accurate data/communication about apparel design and purchasing transactions; (2) reducing the need for floor space in clothing retail stores, which in turn eliminates overhead cost associated with lighting, climate control, personnel, logistic costs, the carrying of inventor and overstock obsolescence; (3) improving customer satisfaction and buying experiences by personalizing and customizing the process; (4) improving the availability of stock and providing a wider range of options to the customer; (5) providing online access to otherwise unknown designers; (6) increasing the designer's ability to market and sell to a specific customer; (7) perfecting the two way information sharing between industry and client; (8) eliminating the size confusion a customer experiences between different suppliers/manufactures; and (9) optimizing the product to customer satisfaction, which in turn reduces that rates of return of purchased items.

Figure 2:
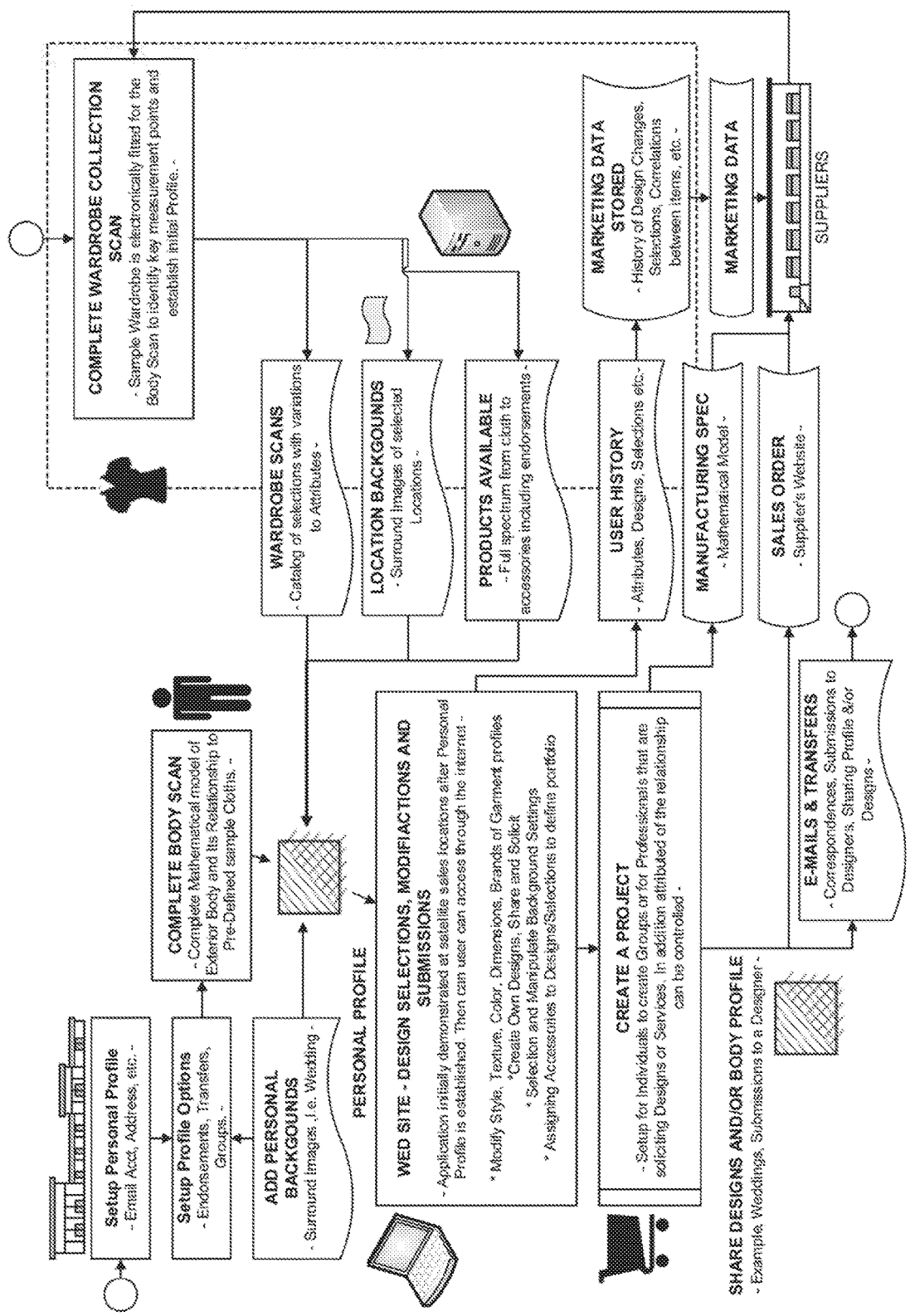
FIG. 2 is graphical overview of the process of simulating a virtual fitting room according to the present invention.
Figure 3:
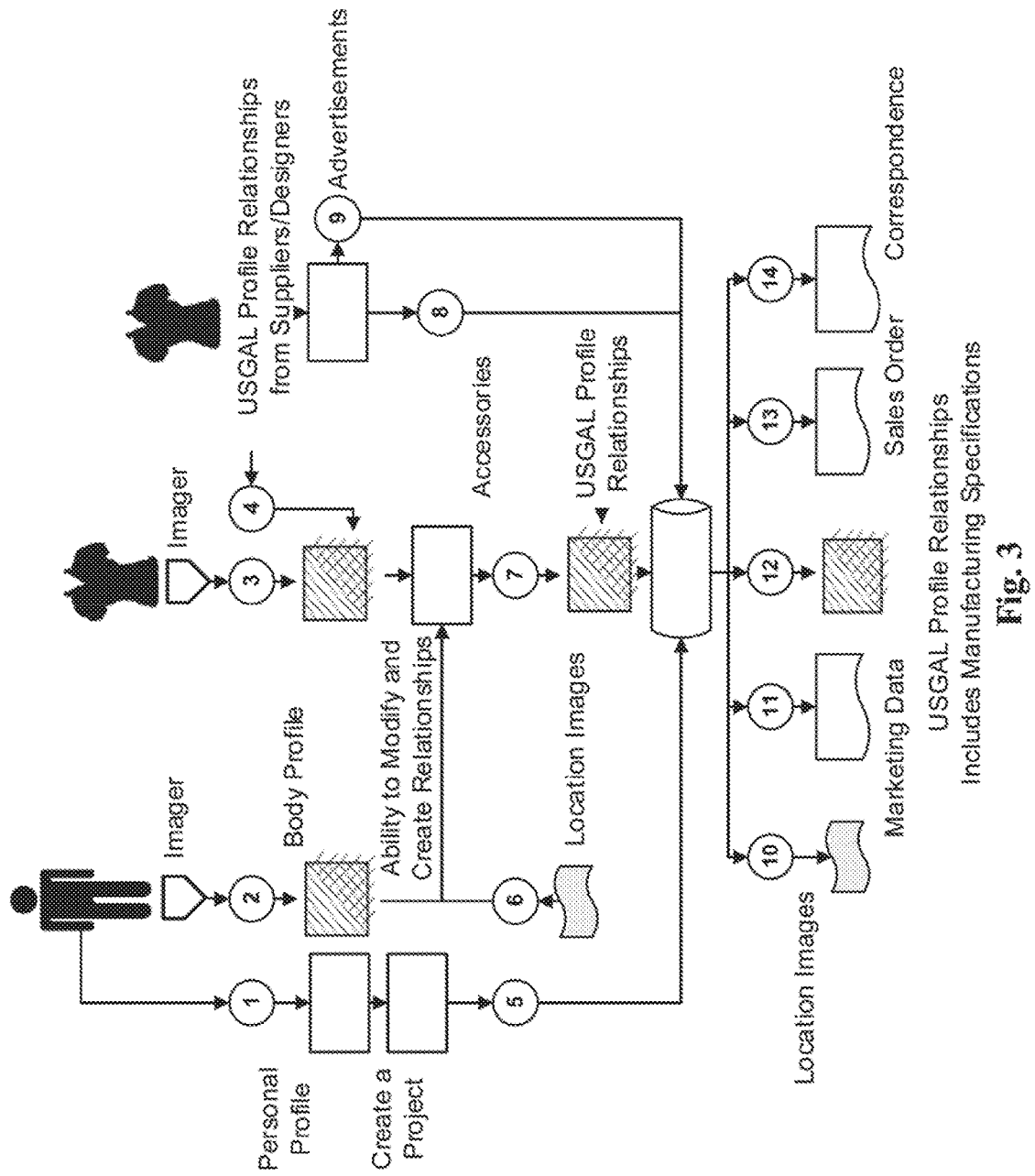
FIG. 3 is a graphical illustration of the channels of data flow between users and clothing suppliers or designers according to one embodiment of the present invention.
Figure 4:
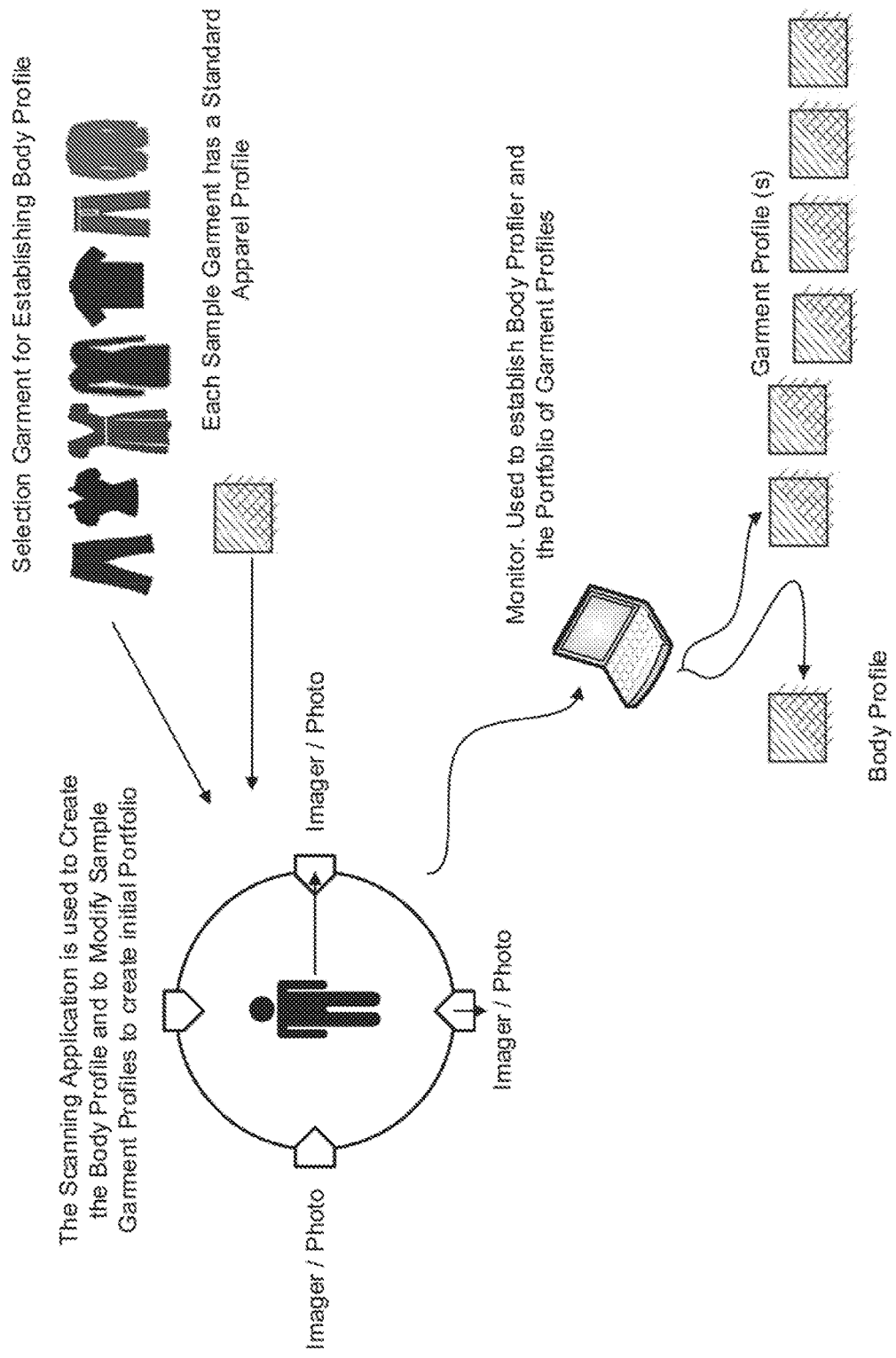
FIG. 4 is a schematic illustration of the creation of a Body Profile according to an aspect of the present invention.

With reference to FIG. 2, the system and method of the present invention is initiated by the creation of a user's personal profile of basic information which may include: (1) username; (2) password, (3) first and/or last name; (4) home address; (5) email address; (6) age; (7) gender; and (8) current weight. Creation of the user profile can be completed in the home or at a retail storefront or even in a retail clothing establishment equipped to implement the system and method of the present invention. Included within the user's personal profile is the Body Profile. With reference to FIG. 4, a Body Profile for each user is developed by providing the system with specific measurements for the body of the user which may preferably be accomplished by having the user's body scanned by a 3D body scanner capable of capturing a detailed and highly accurate measurements of a the surface of a 3D object for translation into a computer mathematical model of the object by a 3D modeling, software system such as, for example, SolidWorks Simulation, offered by Dassault Systèmes SolidWorks Corp., or the NASTRAN system. Most preferably the initial scanning for the Body profile is completed at an Model store or similarly authorized location performing 3d modeling but acceptable results can be obtained by a 3D home scanning kit utilizing home imaging systems such as, for example, the Kinect of motion sensing input device (Microsoft), or by any other device or means known in the art for capturing precise measurements of a 3D object for translation into a computer model. Photographic images of the user are also captured during the body scan and incorporated into the computer model and User Profile. The User Profile including the captured measurements is transmitted via a communications network to the data processing system for use and storage in the database management system as will be described.

With further reference to FIG. 4, the initial scanning to create the user's Body Profile preferably takes place with the user wearing minimal and/or form-fitting underwear of clothing so as to obtain the most accurate measurements of the user's body in a neutral (standing) position. Additional scans of the user may be taken in various other "distorted" body positions requested by the user, designer, manufacturer, or retailer to form an expanded or Modified Body Profile which provides the user with a realistic end experience, and minimize erroneous purchases or accessories that would not provide a comfortable fit for the user in certain positions. Physical body positions used to create the "distorted" Body Profile may include standing in place, sitting in place, holding of breath, standing on heeled platforms, crouching, bending, etc. As above, data associated with these "distorted" Body Profile scans may be stored in the database management system according to the present invention and associated with the user's unique user profile, as described in further detail below.

Data from the initial scan(s) taken of the user wearing minimal or form-fitting clothing is provided fed into a mathematical image setting, CAD solid modeling system, NURBS system, Tukacad system, or a combination of the three to fine tune the 3D virtual rendering into a highly accurate, photo realistic representation of the user's body without clothing. This rendering is termed the user's Body Profile. Optionally, the present invention may "dissect" a user's Body Profile data subsets to describe one or more specific user body part. Individual body part data subsets may be used to help manufacturers, designers and/or retailers tailor their product offerings to a specific customer base based on the specific physical characteristics of individual potential or actual customers or on a composite of these customer's body part data. Specific body parts selected for data "dissection" may include neck, shoulders, chest, belly, waist, thighs, knees, and calves, or other body parts that have a specific impact on the fit and/or feel of one or more types of garments. Data corresponding to individual user body parts and to each user's overall Body Profile may also be stored in the database management system according to the present invention. Data corresponding to an individual user may be associated with his or her personal user profile, and data corresponding to measurements of users taken across the entire population of users of the present system may also be correlated within the database management system and/or accessible to clothing designers, retailers, manufacturers, etc. based on the preferences of the user and/or system administrator.

In addition to scanning the user in minimal clothing/underwear, the software of the present invention creates one or more Space Profiles specific to each user by capturing information gathered from scans of the user's body while the user is wearing standard garments/apparel which may be of known physical and material properties for the various types and sizes of garment for which the user wishes to be virtually fitted. Standard garment(s) worn during these subsequent scans are used to create one or more Space Profiles for the user which may be chosen by the user him or herself based on the fit of the standard garment(s) on the user's body, or may be selected from a predetermined range of "standard" sizes currently provided by clothing retailers or manufacturers. The system of the present invention compares the data from the scan used to create the Body Profile to the data from each scan wherein the user is wearing a standard garment to generate a Space Profile unique to each use and garment type. When a system such as IModel is used to obtain these measurements, the system may calculate the dimensional relationship and material deformation between the virtual Body Profile, and each standard garment chosen for these subsequent "Space Profile" scans. An IModel or like system can then utilize virtual realistic rendering to display a true representation of a customer modeling a garment.

Upon completion of his or her Body and Space profiles through the scanning process, and upon the generation of his or her user profile, which is accomplished by the user by uploading his or her Body and Space profiles into the database and, preferably, completing a questionnaire regarding his or her personal preferences, as well as entering a preferred username and password for access to his or her user profile, the user may begin using his or her personalized virtual fitting room via the electronic marketplace as described further below.

Figure 5A:
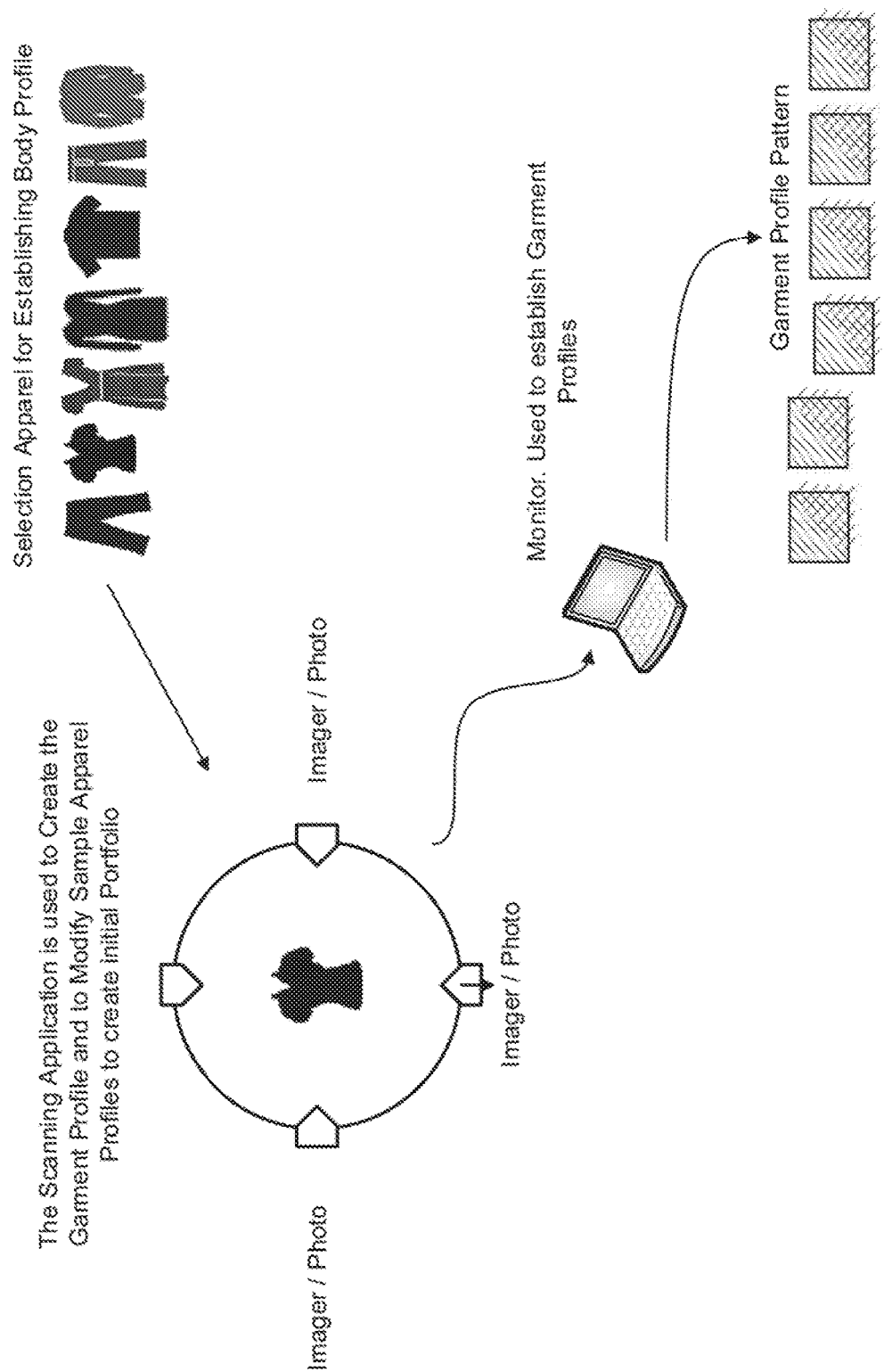
FIG. 5A is a schematic illustration of the creation of one or more Garment or Accessory Profiles according to an aspect of the present invention.

With renewed reference to FIG. 2, the system and method of the present invention comprises a database of garments and accessories of different types and sizes, herein, the "product catalog" or Wardrobe, which is created and maintained on the database management system. This may be achieved by uploading individual garment/accessory characteristics, such as measurements, cut, fabric type, material type, closure type, weight, etc., to the electronic database maintained on a remote server. Data contained in the product catalog may be provided by the garment/accessory manufacturer or designer or by 3D modeling or scanning of said garments/accessories by the designer, manufacturer, retailer, or a third party, as depicted in FIG. 5A. Alternatively, the present invention may access and utilize, or add to, an existing computerized library of garments/accessories, provided that said library contains the requisite type and quality of measurements for each garment/accessory, as described in more detail herein. Such a library may be created by any other means known in the art and implemented by the garment/accessory designer, manufacturer, and/or seller, such as those entities that currently operate online clothing stores.

Figure 5B:
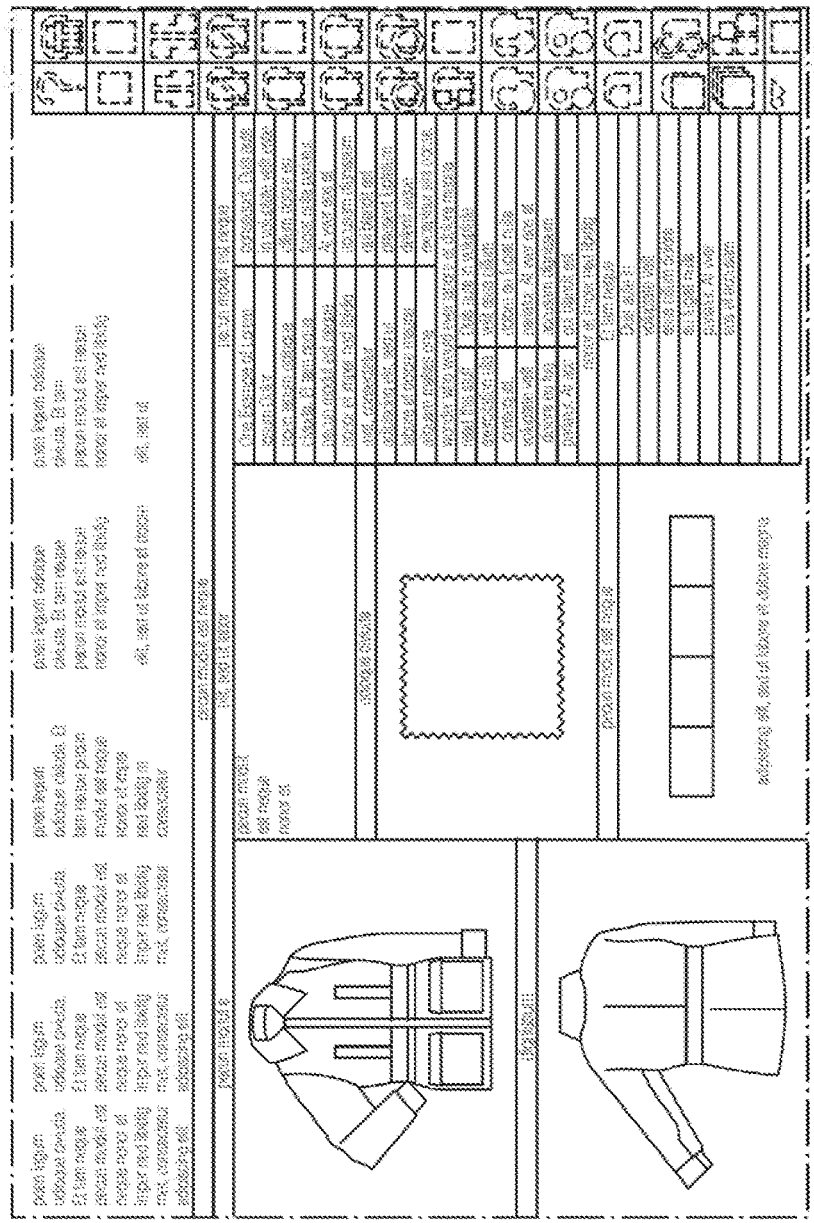
FIG. 5B is a graphical representation of the data that makes up one entry for a specific garment stored in the product catalog according to one aspect of the present invention.

With reference to FIG. 5B, for each garment and accessory, the present invention creates a. Garment Profile or Accessory Profile, respectively, by cross referencing each of the virtual garments/accessories in the product catalog to a material type, and a specific elasticity for same. The specific elasticity for each garment/accessory can be determined by a computerized matrixing operation. These Garment and Accessory Profiles make up the product database, and contain the characteristics and elements that can be later imputed, along with the user's Body Profile, as described below, into the finite element analysis in order to calculate a USGAL profile, also as further described below. As stated, the Garment and Accessory Profiles are stored in the virtual product catalog, which is updated or expanded as necessary to match the range of garments/accessories actually offered by one or more retailers, designers, or manufacturers who elect to have their products advertised in the product catalog and virtually fitted to users according to the present invention. Additionally, the product catalog may be expanded to include garments/accessories of the user's own design, as further described below. User-designed garments/accessories may be stored in the product catalog (categorized as described below) which is available to all users, or may be stored in a separate electronic database stored on the database management system of the present invention and linked to the user's personal user profile (described in more detail below). Alternatively, user-designed garments/accessories may be stored locally on the hard drive of the user's own remote computing device, such as to laptop or smartphone, and made accessible to the software application of the present invention via user granted access to same.

The system then uses each user's Body Profile (and/or variations to the Body Profile measured via the user's "modified" Body Profile) to create a 3D "avatar", specific to each individual user, to aid the user in visualizing one or more selected garments and/or accessories as they would be applied to the user's own body and in a location (background image or video) of the user's choosing, as described herein. A graphical representation of a sample "avatar" is shown within a "virtual, dressing room" GUI in FIG. 9.

Each user's generated Body Profile and Space Profiles are entered into to "user database" within the database management system according to the present invention that is also maintained and updated with new data from new users and with revised data from existing users as their body shape or size changes (as captured by additional body scans at the user's initiation or based on a prompt from the system, which may occur regularly at predetermined intervals, i.e., every two years). Within the user database, each user's Body Profile and Space Profiles are matched to a unique "user profile" specific to the individual user, which also contains the user's shopping or style preferences (as entered by the user, preferably via a questionnaire upon signing up for the service provided by the present invention), measured body composition, history of garment/accessory selections, additional user preferences (such as garment/accessory layering preferences, also entered by the user as described above), and transaction history, as described in more detail below, as well as all historical modifications to any attributes of the user's Body or overall USGAL Profiles (comprised of Body Profile, Shape Profiles, Locational Profiles, Garment Profiles, and Accessory Profiles). The user database of user profile records may be maintained in a remote storage database (e.g., a remote database, or a network based storage resource such as a cloud storage service, etc.), and each user may access his or her own user profile via a username and password combination or the like.

The "user database", comprising individualized use profiles, Body Profiles, and avatars created by 3D modeling of each user's individual Body Profile, and the "product database" are accessible by an "electronic marketplace", an application housed on, i.e., a remote application server. According to the present invention, the electronic marketplace communicates with individual, user's remote computing devices via it communications network, and includes software for the generation of a graphical user interface (GUI) for a "digital fitting room", as further described below, accessible by each user.

The electronic marketplace further includes means by which an individual user may access and or edit his or her user profile by, i.e., additional Body or Shape Profile scan data, revising his or her preferences or answers to a questionnaire presented to the user upon signing up for the service provided by the present invention, etc. Access to each user's personalized user profile and digital fitting room is controlled by username and password control, or via like electronic access and security means known in the art. The electronic marketplace is preferably accessible to the individual user via one or more devices at one or more locations through one or more networks, such as via a mobile device over a communications network. The electronic marketplace may also be accessible by garment/accessory designers, manufacturers or retailers via username and password control to allow each subscribing or qualified designer, manufacturer or retailer to add to, remove or modify Garment or Accessory Profiles contained in the product database for garments or accessories made available for purchase by the respective designer, manufacturer or retailer through the electronic marketplace. The electronic marketplace may also facilitate communication between users or between a use and one or more manufacturers, retailers, or designers for the purposes of completing transactions related to the items in the product catalog and/or to aid a user in creating a custom garment or accessory. Means for creating a user profile, and means for qualifying and granting access to a user, designer, manufacturer or retailer in the electronic marketplace ma be determined by the administrator of the electronic marketplace as a matter of design preference, or may be orchestrated by means known in the art.

As stated, the electronic marketplace also preferably includes a means for facilitating online transactions between users and those authorized to sell the garments or accessories in the product database. Secure online transactions may be facilitated directly through the electronic marketplace, or users may be directed to the individual retailer's existing online store after selection of a garment or accessory for purchase via the fitting method described herein.

The electronic marketplace software according to the present invention also preferably includes means for transfer of digital Garment or Accessory Profiles user Body Profiles, user preferences and/or the rights to view and utilize Garment or Accessory Profiles or user preferences to other users or to participating designers, manufacturers, or retailers via an online network. A permissible transfer of digital garments includes a conveyance of access rights associated with a digital object which is made in accordance with policies enforced in the electronic marketplace, and may include digital garment licensing conditions, legal requirements of the country or jurisdiction to which the electronic marketplace is subject, etc. This functionality of the electronic marketplace may also allow for designers, manufacturers, retailers, or other users to make "suggestions" to an individual user of garments and/or accessories that the suggesting party thinks the user would like. Such suggestions may be transmitted to an individual user based on that user's personal communications preferences, as indicated in his or her personal profile. A "suggested" garment or accessory may appear in the user's personal virtual dressing room GUI, as described below, along with information about the date, time, and source of the suggestion, for the user to select for simulation on his or her avatar and/or for purchase from the providing retailer or user.

In addition, a user's decision to transfer or allow the transfer of his or her Body or Space Profiles to another user or to a manufacturer, retailer or designer enables the process of custom garment and/or accessory design or manufacturing by a designer or manufacturer, respectively, for the specific user. Through this feature of the present invention, a user may either transfer his or her Body and/or Space Profiles to a designer/manufacturer for the designer or manufacturer to use in designing a custom garment/accessory for the user, or the user may request that an existing garment or accessory offered via the product catalog be altered by the providing designer or manufacturer to fit his or her Body and/or Space Profiles (a "design change request"). Thus, the present invention allows the transfer of not only Body/Space Profile Data, but, optionally, the transfer of one or more Garment or Accessory Profiles and/or instructions along with the user's personal Body Profile or Space Profile data. Preferably, where Space Profiles are based on garments that the user sees as an "ideal fit", this process involves the transfer of a Space Profile to allow the designer or manufacturer to craft the garment or accessory to the user's liking in terms of the fit of same on the user's body. After the data transfer, the system may facilitate additional communications between the user and the selected designer/manufacturer and/or facilitate a secure sale of the resultant garment or accessory from the designer/manufacturer to the user. The user ma also "design" custom garments or accessories in this way, by inputting features of the desired garment or accessory into the system to create a custom Garment or Accessory Profile that may be transmitted to a manufacturer or uploaded directly into the product catalog. Users that have the resources to both design and manufacture garments or accessories to be offered for sale may also input Garment or Accessory Profiles into the product catalog for browsing by other users.

In a preferred embodiment, the system according to the present inventions generates one or more recommendations for the user based on the user's interactions within his/her digital fitting room, and/or one or more electronic virtual clothing stores operated by a designer, retailer, or manufacturer that lists products in the product database according to the present invention. These user interactions may comprise purchases, item selections, category selections, searches, response to solicitations and the like. For example, as described below and illustrated in FIG. 8, the system of the present invention uses a sliding scale to indicate the amount of space between the user's body and a specific garment (or accessory) chosen for simulation on the user's body. The system thus graphically illustrates to the user the type and degree of deviation of the chosen item from the user's body and/or from an ideally-fitted garment/accessory of the same type by comparing the Garment or Accessory profile for the chosen garment/accessory to the user's Body or Shape Profile, respectively. Where a user-selected item does not provide the proper fit for the user's unique body shape, size, etc, the system may optionally offer the user alternative garments and/or accessories from the product catalog that will provide a better fit for the user's body used on the system's comparison of the user's Body and Shape Profiles to Garment and Accessory profiles available in the product catalog. The definition of "proper fit" may be determined by the system as a certain "point" in the scale depicted in FIG.

8, or may be based on the user's preferences, as described above and below, for how he or she likes his or her clothes to fit various parts of his or her body. The user (r the system) may also choose to limit the database of "alternate" suggestions to be proffered by the system based on price point, designer, etc., either overall or based on a preset deviation of these characteristics from those of the user-chosen garment or accessory. "Alternate" suggestions may also be culled from "popular" garment or accessory selections, as determined by the system based on historical user activity (for the individual user at issue or across all users), or may be selected from items selected for simulation or purchase by the user's family members, members of the user's social groups, or other users with whom the user communications through the present invention. The user may indicate in his or her user profile those individuals to whose user activity the system should look for alternate recommendations.

Also in a preferred embodiment, instead of browsing the product catalog him or herself to search for acceptable garments and/or accessories to virtually "try on", the user may opt to have the system make an initial suggestion for him or her, either based on a specific category or style of garment or accessory, or based on an overall "best fit" judgment made by the system by comparing the user's Body and/or Space Profiles with all garments and/or accessories available in the product catalog.

Specific, aspects of the present invention will now be described in greater detail below.

User Profile

The user profile is the user account record that provides the user access to and the ability to select, modify, group and create USGAL profiles. User profiles are maintained in a user database accessible by the electronic marketplace. The information contained within user profiles allows the system of the present invention to separate users into categories based on predetermined individual characteristics, and to compile data that may be useful to manufacturers and designers. User information contained within each individual user profile may include: (1) username; (2) password; (3) first and/or last name; (4) home address; (5) email address; (6) age; (7) gender; and (8) current weight. The grouping and separation of these user demographics may optionally allow designers, retailers and marketers to access information specific to one or more distinct user "groups" based on similarities of the characteristics listed above. This information may allow designers, retailers and marketers to tailor their marketing efforts to one or more specific user groups based on these characteristics and the activity of users with these sets of characteristics interact with the virtual fitting room, product database, and other features of the system according to the present invention.

User profiles may also contain or be linked to one or more standard or user-generated Locational Profiles (which also form a part of a user's USGAL profile(s)), a photo or video within which or in front of which the user can visualize his or her avatar wearing a chosen garment and/or accessory, as further described below. Data included in the user profile for each Locational Profile may include: (1) picture or video name; (2) location category; (3) camera make/model with which the photo or video was taken; (4) date that the photo or video was taken and/or modified; (5) dimension and/or resolution of the photo or video; and (6) size of the photo or video.

A user may also access his or her individual user profile to, i.e.: (1) set and modify his or her password; (2) share his or her e-mail address with another user, manufacturer, retailer or designer; (3) share his or her USGAL; and (4) allow or decline solicitations and/or suggestions for garment/accessory purchases from one or more specific designers/manufacturers/retailers.

User profiles may also be accessed by a program administrator for group management. A program administrator may access one or more individual user profiles to create user "groups" as described in more detail above. The program administrator may access one or more user profile to input/edit: (1) user group number; (2) user group description; (3) user group ID; (4) user group author; and (5) group preferences, such as whether to allow changes to style, color, length, etc. of garments or accessories, and whether or not to mask an individual's Body Profile when/if that individual's Body Profile is sent to a manufacturer, retailer, designer, or another user. These functionalities may be used by retailers, designers, or manufacturers to group specific current or potential customers based on their actual physical characteristics and garment/accessory preferences as desired to market to specific subsets of the consumer base.

USGAL Profiles

The user database may comprise one or more USGAL Profiles for each individual user, comprising, a combination of Body Profile, Garment Profile, Space Profile, Accessory Profile, if desired, and Locational Profile. For example, for a female user, one USGAL may be created from a scan of the user's body wearing high heels, while another may be created by a scan of the user's body in flats. Alternative USGALs may be created from scans of a user's body in different positions, such as in an athletic pose. As stated above, each user's Body Profile will preferably include measurements taken during a scan while the user is in different positions, such as standing and inhaling, or standing while flexing his or her muscles. These will all be incorporated into the user's USGAL by the system. The initial body scans and bad composition measurements taken of the user may be complimented and calibrated by the use of a device/method of applying radial pressure to distinct body parts, and measuring the diameter/circumference of the body parts at that pressure, and/or vice versa.

Each USGAL will also include a "level of comfort" indicator, indicating the user's desired fit of the garments associated with each USGAL. "Level of comfort" indicators may be categorized as follows (in units of psi/distance between body and garment):
 −5=oversized to baggy fit;
 −4=baggy to loose fit;
 −3=loose fit to slack fit;
 −2=slack fit to contour;
 −1 contour to form fit;
 0=form fit to snug fit;
 1=snug fit to slight pressure;
 2=slight pressure to snug pressure;
 3=snug pressure to form changing pressure;
 4=form changing pressure to body mark pressure;
 5=body mark pressure to painful pressure.

This numeric "level of comfort" scale may be displayed in the virtual fitting room GUI, as described in further detail below, i.e., in a sidebar alongside the GUI of the user wearing the selected garment on top of the Locational Profile, and will be calculated based on the finite model simulation incorporating the Body Profile and the Garment or Accessory Profile for the selected garment or accessory. The "level of comfort" scale may also be associated with a color scale, such as blue to indicate a "level of comfort" of −5, transitioning all the way up to red to indicate a "level of comfort" of 5. A sample color scale as applied to a user avatar is shown in FIG. 8. Therefore, for example, a color red around the waist of the user's avatar, which the user has chosen to simulate wearing jeans, would denote the jeans applying a painful pressure in that area, and having an interference of −2, meaning a diameter decrease of 2 inches in the user's "virtual" waist caused by the jeans.

Body Profile

Figure 7:
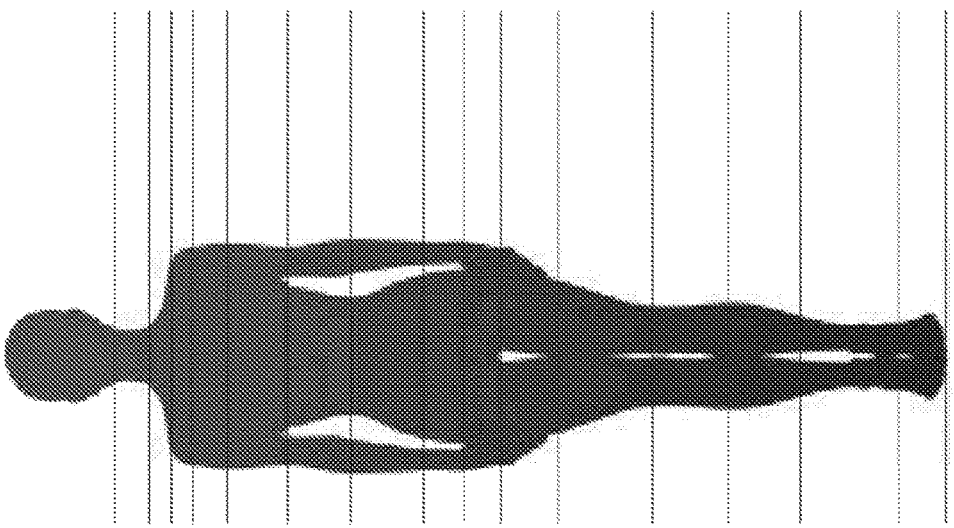
FIG. 7 is a schematic illustration of distance and mass measurements used in the creation of a Body Profile.

The following table summarizes the measurements that are taken to create an individual user's Body Profile, and how they are taken, with further reference to FIG. 7:

| Description | Distance Measurements | Mass Measurements |
|---|---|---|
| Neck | 01B. Mid Trachea | 01D. Splenitis |
| Top Shoulder | 02B. Mid Cervical | 02D. Deltoid |
| Mid Shoulder | 03B. Sternum | |
| Chest | 04B. Sternum | 03D. Pectorail |
| Belly | 05B. Button | 04D. Oblique 1 |
| Waist | | 05D. Oblique 2 |
| Hip | 06B. Llium | 06D. Oblique 3 |
| Butt | 06B. Sacrum | 07D. Glutes |
| Groin | 07B. Pubis | 08D. Longus |
| Top Thigh | 08B. Femur | 09D. Sartorlus |
| Mid Thigh | 09B. Mid Femur | 10D. Femoris |
| Knee | 10B. Patella | |
| Calf | 11B. Mid Tibia | 11D. Tibialis |
| Ankle | 12B. Talus | 12D. Digitorum |
| Sole | 11B. Heal | |
| | 03A. Sacpula | 13D. Rhomboid |
| Bicep | 04A. Mid Humerus | 14D. Bicepts |
| Elbow | 05A. Radius | |
| Forearm | 06A. Mid Radius | 15D. Brachioradialis |
| Wrist | 07A. Carpal | 16D. Flexor |
| Finders | 08A. Phalanges | |

In addition to 3D scanning of the user body parts during the profile creation stage, some of the user's distinct body parts/portions may be measured for their body composition, i.e. percent fat to muscle content. This may be done using the Bioelectrical Impedance Analysis method, DXA, Calipers BMI, Hydrostatic weighing, some combination of the previous, or another method known in the art. A determination of which body parts are subjected to this analysis may be made by the user or may be predetermined based on which body parts have the most variability in fat/muscle ratio or which body parts have the greatest impact on apparel fit based on variability of fat/muscle ratio.

The exact body measurements taken for each user are then correlated to a photograph taken of the user's body at the same time of the measurement scan. Each pixel is aligned, to the center point relationship of the body profile to accurately represent the visual characteristics of the user. The number of "points" in the image is chosen such that the number of "points" is always greater than the number of pixels that the imaging device is capable of capturing. The pixels are aligned to the center point of a square grouping of nine or more points depending on the resolution of the imaging device. The size of the pixel thus dictates the number of points creating the square used for finding the center point.

Garment Profile

A 3D solid model can be generated from a 2D drawing, manufacturing schematic, or sketch of a garment, if enough information is given or known. Much like designer's sketches convey a certain amount of material needed to be cut, trimmed and stitched together to form certain shapes, splines, and standard sizes in creating a garment, so too can these dimensions be fed into a 3D solid modeling Computer Aided Design (CAD) program to render a 3D virtual garment of exact scaled proportions. Additionally, a set of standardized garment measurements set in a spreadsheet can be uploaded into a CAD system, and configured to achieve the same 3D solid model results. Alternatively, a solid model of the forms used by the designer can be obtained, scanned, and shelled to produce the Garment Profile.

Additionally, from the designer's material specification and/or a standard material analysis, material properties can be input into the Garment Profile. Alternatively, empirical testing can be done on new material types, and finally, a library of available clothing material properties can be downloaded or imputed into the Garment Profile.

The exact garment measurements are then correlated to a photograph of the garment taken at the same time of the measurement scan. Each pixel is aligned to the center point relationship of the garment profile to accurately represent the visual characteristics of the garment. Points are always out numbering the of pixels. The pixels are always aligned to the center point of a square grouping of nine points to twenty five points and so on. The size of the pixel dictates the number of points creating the square used.

The Garment Profile also includes data relating to the following garment characteristics: (1) fabric characteristics (content, construction, weight, color, etc.); (2) garment shrinkage properties; (3) garment size ratio and range (4) garment seam types; (5) after-wash dimensions, etc.

Garment measurements may include numerical values for the following garment dimensions: (1) fall bust; (2) waist; (3) hips; (4) upper bust; (5) under bust; (6) nipple to nipple distance; (7) length of shoulder; (8) front length shoulder to waist; (9) outer leg (10) upper knee; (11) calf; (12) neck; (13) arm length; (14) bicep; (15) upper arm length; (16) length of armpit to elbow, etc. Garment manufacturing specifications to be included in the Garment Profile may comprise: (1) sewing allowances; (2) shrinkage allowances; pattern nomenclature; (4) garment sections (i.e., trim, lace, etc.)

Accessory Profiles

Accessory Profiles can be chosen, layered onto the USGAL profile and where applicable can be manipulated for visual purposes. Accessories are positioned in relationship to the Body Profile and are stored in the USGAL profile.

Examples of Accessory Profiles comprise: (1) hat, including the ability to rotate; (2) glasses; (3) neck tie; (4) scarf; (5) purse, with purse location (A) over left shoulder, (B) over right shoulder, (C) in left hand, or (D) in right hand; (6) belt; (7) stockings; (8) socks, including adjustable heights for same; (9) shoes; (10) hair length; (11) hair color; and (12) skin tone.

Locational Profile

Figure 6:
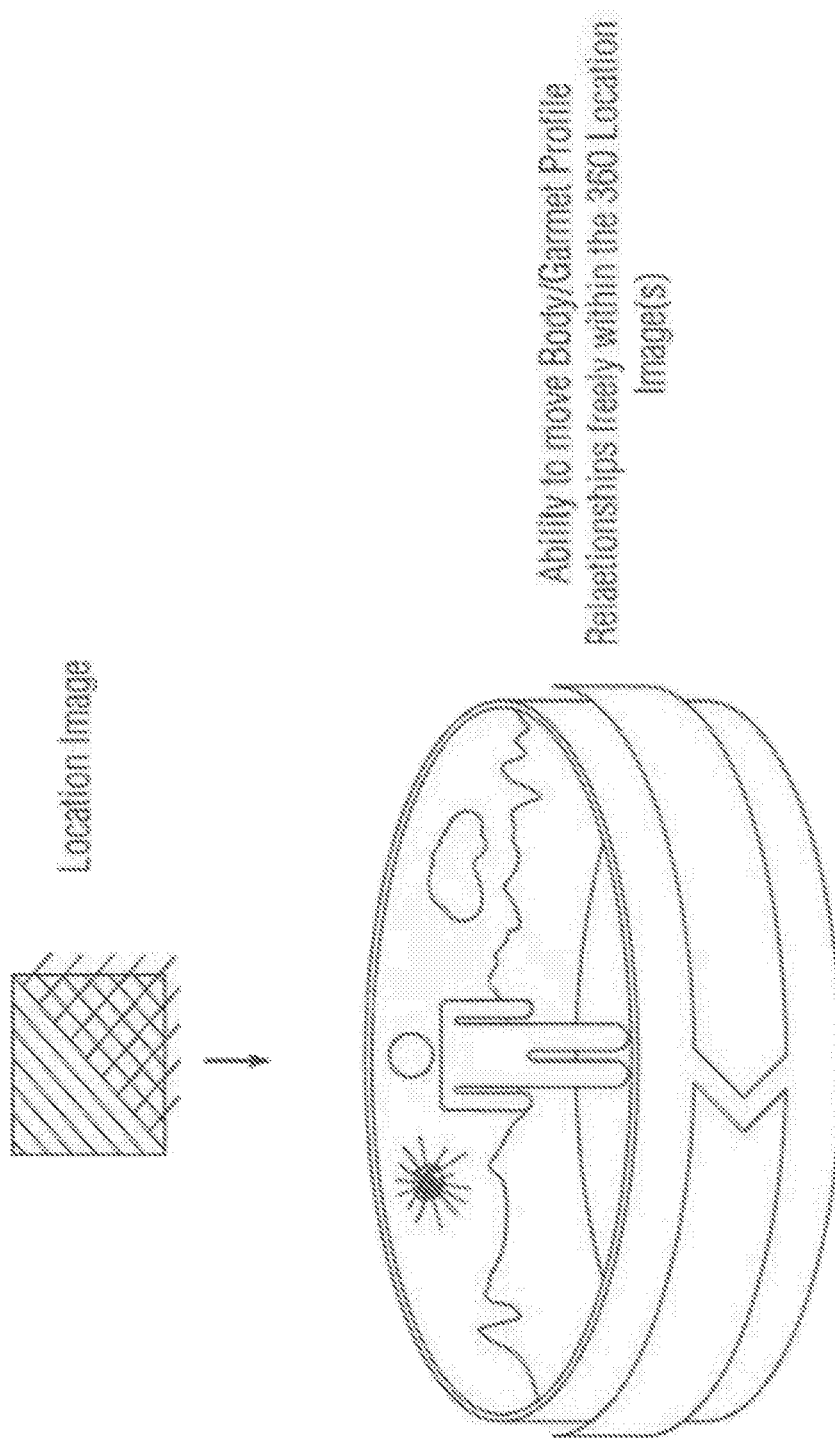
FIG. 6 is a schematic illustration of the creation of a Locational Profile according to an aspect of the present invention.

The Locational, or scenery, Profile can be either two dimensional like the background in a photograph/video or a full surround image, as shown in FIG. 6. When the Body Profile is moved in space, the Locational Profile will move in a corresponding way. Both the Body Profile and the Garment or Accessory Profiles will also be able to move freely within the virtual fitting room GUI as the background image moves in concert. The application according to the present invention thus has the ability to change basic image attributes.

Figure 9:
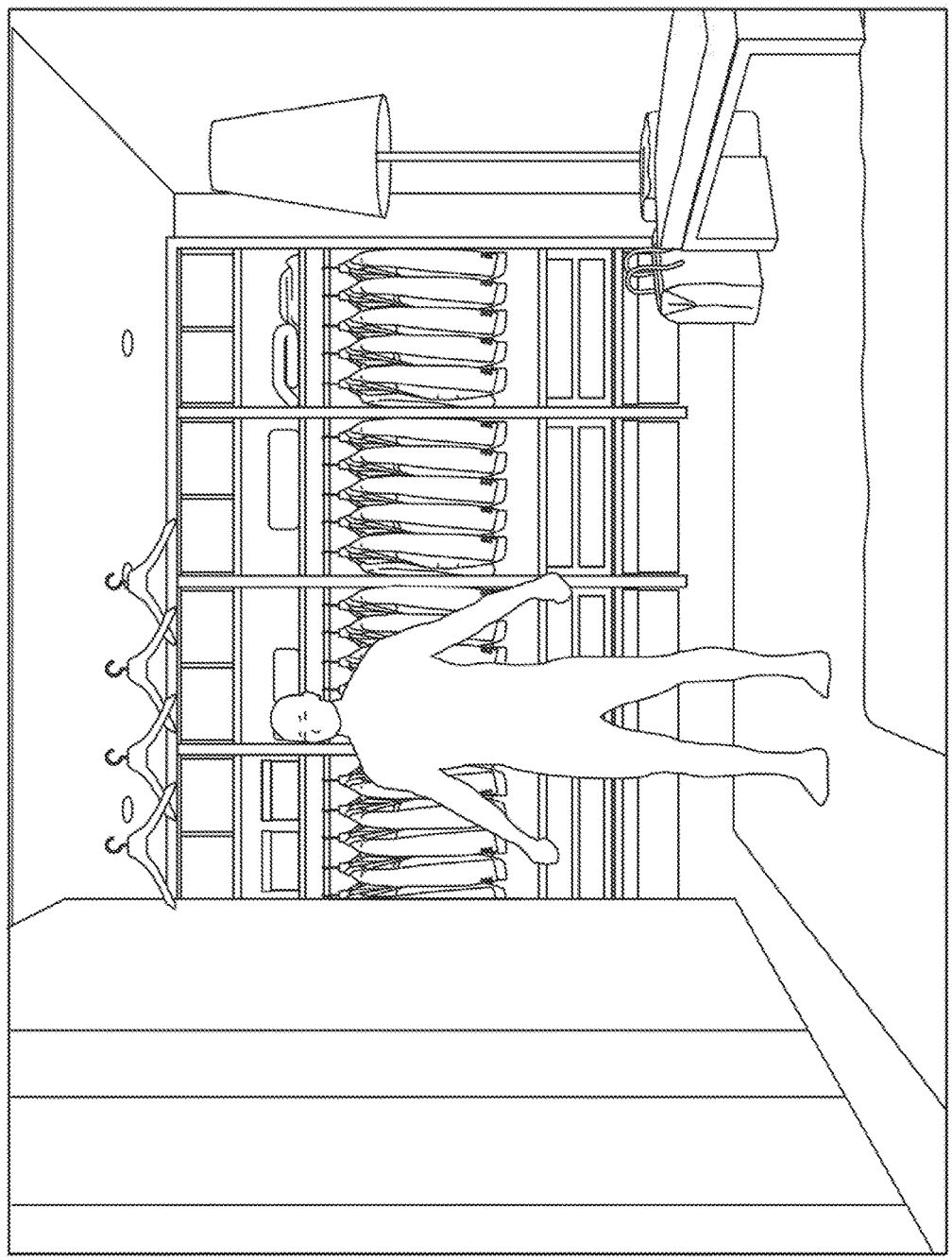
FIG. 9 is a visual, representation of an example virtual dressing room into which a user avatar has been placed according to an embodiment of the present invention.

The standard Locational Profile, or scene, a user will see the first time they log in will be that of a virtual 3D fitting room, as shown in FIG. 9. However, the user will then be able to customize his/her Locational Profile with one of several selectable scenes. These may comprise, for example, a beach, dance floor, wedding ceremony, or park. Each Locational Profile is generated within the virtual fitting room using, i.e., flash panorama software and/or high definition computer generated video.

Alternatively, the user may generate or upload a custom image for use as a background for the virtual fitting room. i.e., a room in the user's own home. The user's USGAL avatar will be placed in the center of the scene, and when they go to view a different part of their USGAL avatar body, the background will change depending on what part of the scene would be seen at any given 360 degree angle opposite the current USGAL avatar view.

The user will have the option of both rotating the USGAL avatar, and having the scene be stationary, or rotating the view around the USGAL avatar, such as if there was a camera going around the USGAL avatar. The user has the ability to change the size, position and orientation of objects in the Locational Profile.

Additionally, the user will have the option to exit the Locational Profile and sew a selected garment or accessory in isolation. The garment or accessory can also be viewed in "pattern view", including pattern lines to provide guidance for cutting fabric or material to manufacture the garment or accessory from scratch; i.e., by the manufacturer.

Product Database

The designer/manufacturer/retailer or other supplier of a garment and/or accessory to be included in the product catalog may access the product database to add or edit: (1) product description and/or brand information; (2) product category; (3) product profile; (4) product style; (5) product color; (6) seller's name; and (7) seller's website address.

Electronic Marketplace

As described above, the electronic marketplace consists of software loused on non transitory memory on, preferably, a remote server, which may be accessed by users via a communications network such as the Internet, a local area network, a wide area network, a wireless wide area network, a cable television network, a wireless network, a telephone network, etc., and via through one of a plurality of electronic devices, such as a personal computer, an entertainment system, a personal digital assistant, smart phone, or other computing, device, that is capable of communication over a network, including but not limited to, set-top boxes, mobile phones, digital media players, tablets, laptop computers, electronic book readers, game consoles, soles, servers, etc. In a preferred embodiment, access to the electronic marketplace is gained by navigating to a specific Internet website, and then logging into a specific user profile with, i.e., a username and password combination.

The server on which the electronic marketplace is housed may be either a single server or a larger collection of servers, such as a data center or multiple data centers. The server may include one or more processors and memory, the memory comprising one or more Computer-Readable Storage Media, (RAM, ROM, EEPROM, CD-ROM, and DVD).

The electronic, marketplace may further comprise one or more user-specific GUIs, accessible by each user through his or her user profile, accessible via his or her username and password, for example. The user-specific GUI may be one of the user's one or more Locational Profile(s). Alternatively, the user may request that his or her username and password are stored by the electronic marketplace and that his her credentials for access to the electronic marketplace are automatically accepted based on the software's recognition of a specific electronic device associated with that user.

Upon the user's first access to the electronic marketplace, the user will be prompted to provide the information necessary to create a user profile, as described above, including, preferably, username and password information. The user will also be required to provide measurement data sufficient to generate a Body Profile and, preferably, one or more Space Profiles, which may be collected via 3D scanning technology, also as described above. At the initiation of the user's membership, a personalized database within the overall user database will be created for the user containing his or her user profile and the scanned measurement information obtained during the initial user scan. The user's database ma also include a Locational Profile selected or uploaded by the user, or a generic Locational Profile will be displayed during the user's first access to his or her virtual fitting room. During the user's subsequent interactions with the electronic marketplace, which is thereafter displayed to the user via his/her personalized Locational Profile, the user can save additional information to his or her personalized database, such as ensembles, avatars, purchase history, poses and positions for his or her one or more USGALs, in an amount determined by a pre-determined storage limit for each user profile defined in size in bytes, a number of files, etc.

After creation of his or her user profile, upon logging into the electronic marketplace, the user will be directed to their personalized virtual fitting mom and virtual closet. The virtual fitting room GUI is designed to act like a virtual changing, room. From the data contained within the user's Body Profile, the software will create an "avatar" for each user, as described above, which will be situated in the middle of the virtual fitting room in front of or on top of the chosen Locational Profile. Around the user's avatar will be a series of icons representing links to the product database, which may be categorized into garment/accessory type such as jeans, dresses, shirts, etc., whereas each category may be represented by a separate icon linking, to that portion of the product database. Preferably, icons linking to categories of garment items will appear above the user's avatar, depicted as "hangers" in the virtual fitting room, and icons linking to accessories such as hoots, loafers, sneakers, purses, etc, will appear below the user's avatar, depicted as "cubby" boxes. Clicking on one of the icons (for example: jeans) would take the user to another window having several other icons denoting type, style, cut, texture, color, etc. of the chosen garment, with these additional icons representing additional sub-categories of garments in the product database. This would be designed in a hierarchical family format. For example, selecting the jean icon, will direct the user to several icons of different jean types. Selecting skinny jeans would then open up more icons, selecting no pockets would take the user to more icons, selecting low cut will take the user to more icons representing further subcategories of garments, and so on and so forth. Each icon will link to an ever decreasing dataset of items in the product database.

Once the user has narrowed down his or her selection, he or she may be presented with visual representations of the garments/accessories in the chosen category or subcategory of the product database. Clicking, on a specific garment/ accessory will cause that garment/accessory to be displayed "hanging" in a closet in the virtual fitting room GUI (see FIG. 9). This may be repeated for several garments/accessories until the user has chosen a complete ensemble. Alternatively, the user may make only one apparel selection. At any point during this process, the user may select a garment to be visually represented on his or her avatar. The user may select one or more garments/accessories to be so represented, or may return one or more of the items displayed on his or her avatar back to the virtual "hanger." With any garment/accessory item that has been virtually placed on the user's avatar, the user may use numerous positioning and rotation icon options that would allow the user to rotate his or her avatar, zoom in, rotate the scene, etc., to view the fitting of the garment/accessory on his or her avatar to his or her satisfaction. After a simulation is completed, the user will have the option to either place the outfit/item in his/her shopping cart, or to return the items to his or her virtual "closet", whereby the items in a user's virtual closet will be stored to an additional electronic database that will then be associated with the user's profile for further use. Choosing to add an item to his or her shopping cart may cause the user to be presented with a link to the website of the item's manufacturer/designer/retailer for purchase as described above.

A user may use the personalized virtual fitting room interface to access and manage his/her previous and current outfit ensembles and simulations, within his/her personalized database. The user may also suggest, or transfer, selected ensembles to other users based on each individual user's "transfer" preferences, as described above with respect to each user's profile. Based on those preferences, one of the virtual "hanger" icons in a user's personalized virtual fitting room may be designated for suggested ensembles from other users, manufactures and retailers, designers, groups, IModel design techs, or any other third party. The user will be able to browse through these suggested selections, if he/she has chosen to receive such suggestions, choose to simulate a selected ensemble or one or more garments or accessories on his or her avatar in his or her personalized virtual fitting room, or communicate with the party providing the suggestion via the electronic marketplace. The user may also use this suggestion area to list or otherwise seek to obtain a wanted ensemble or design advice/a custom designed garment or accessory from a third party, as further described above. Once all or part of the ensemble is located or designed, the ensemble or piece will be moved and flagged as a requested suggestion within this area.

Other options that may be included in the user's database and/or represented by icons in the virtual fitting room include: user's purchases, selections, views, searches, ratings, page requests, additions of items to wish lists and shopping carts, user interface events, tagging activity, combinations of the same, and/or the like. Wish lists may include but are not limited to: wish list to self or other users, wish list to groups, wish list to designers, layaway programs between the user and site, or between the user and other users, and between the users and a third party, such as a designer, clothing store, or clothing manufacturer.

Users may use these portions of the database to advertise garments they no longer choose to own or wish to trade, and wish to sell to other users, groups, or third party, as well as for user-designed garments or accessories. The number of trades or wish list items may be limited by the site, or a fee may be levied for each transaction. These items may be items that do or do not require a simulation on a user's avatar, such as a dress or shoes, respectively.

The software according to the present invention may further include a data mining service that generates and provides designer/retailer/manufacturer access to mined data, such as user "groups" as discussed above. The data mining service may generate mined data by analyzing users' purchase histories, item viewing histories, sizes by geographical location, style purchases by geographical location, ages, social groups, affluence, occupation, or other user activity data, and by detecting and quantifying behavior-based association between specific items. More generally, associations can be based on correlating activities made by users. Associations between items may, for example, be used to detect items that are substitutes for and items that are complementary to each other. Complementary items comprise items that are often purchased together and are complementary, such as a purse and wallet, or sweater and scarf. Substitute items comprise items that provide the same use, and are often viewed in succession, and are substitutes for one another, such as two sweaters of different designers, or two sweaters of different price ranges.

The designer/manufacturer/retailer or other supplier may also access the electronic marketplace and/or product database to provide advertisements to users for garments and/or accessories to be virtually fitted and/or purchased by the user via the electronic marketplace. Fields accessible for this purpose include: (1) advertisement code/category; and (2) advertisement description. The electronic marketplace will output the following fields for each advertisement: (1) target user's USGAL, in any preferred arrangement; (2) target user's characteristics (sex, age, state/country of residency, etc.); (3) target user's selection and shopping history; (4) marketing categorization choices.

Also as described above, the electronic marketplace preferably can facilitate retail transactions between designer/manufacturer/retailer or other supplier and user(s). In a preferred embodiment, the electronic marketplace maintains a database of electronic, transactions, including the following fields: (1) sales order detail; and (2) sales order conformation. Sales orders may be processed and completed through a link from the electronic marketplace to the website of the garment/accessory supplier.

The electronic marketplace may also facilitate communications between users, or between users and designers/manufacturers/retailers. In a preferred embodiment, the electronic marketplace maintains a database of these communications, including (1) sender's and recipient's email addresses; (2) email subject and body; and, optionally, (3) information on a user's USGAL profile that may be attached to the correspondence.

Users may select privacy settings on their user profile to indicate whether they want their personalized databases to be available as a source (i.e. user) personalized database; for example, a user may be presented with an option to allow or deny an ensemble/garment suggestion to be entered into his/her personalized database from any third party or category of third party. A user may thus choose to have his/her suggestion inputs be filtered by a number of factors, for example, a user may want to have his/her suggestions compiled only from the least expensive available, or from a certain designer, or only from members of an affinity group, such as a club, church, or social networking group. From these suggestions, general searches, simulations, and garment purchases, the system may selectively filter recommendations provided to the user to generate personalized garment and/or accessory recommendations for each user.

In various different implementations, apparel simulations and selections in a user's personalized database "closet" may be streamed to the user's local computing device, downloaded or synced to another user's personal database, or otherwise accessed by a user through a personalized database interface via one or more devices at one or more locations via one or more networks. Thus, assembling, a specific outfit results in a copy of the ensemble being fixed (at least temporarily) in memory of the receiving storage location or computing device.

User behavior trend data is accompanied by authorized USGAL profiles that contain all the development data associated with a particular USGAL grouping. This would include, for example, brand selection and garment modifications.

Key outputs from the electronic marketplace that may be accessible to users and/or designers/retailers/manufacturers include, but are not limited to: (1) USUAL profiles; (2) arrangements of USGAL profiles; (3) manufacturing garment specifications created by individual users to suit his or her specific tastes; (4) user selection and profile modification history; (5) project user group arrangements; (6) sales orders; and (7) correspondences.

Finite Element Analysis

Fitting of a chosen garment/accessory onto a user's Body Profile generated avatar is accomplished through a finite element analysis in which the garment and body profiles are discretized and the displacement formulation of the finite element method is used to calculate component displacements, strains, and stresses under the internal and external loads. The geometry under analysis is discretized using tetrahedral (3D), triangular (2D), and beam elements, and typically solved by either a direct sparse or iterative solver. Together, the physical and scanned body measurements comprise the data needed to develop one half of the finite element assembly model, i.e., the Body Profile. When this rendered solid Body Profile is coupled with the material property component, i.e. the Garment or Accessory Profile, comprised of the physical clothing dimensions and the obtained material properties of each garment and accessory as pulled from the product database, a finite element equation will be generated that the software will use to provide the deformation and stresses to be displayed on the user's avatar and to provide the user with an accurate representation of the selected garment or accessory on the user's body. The finite element model utilizes the forces being applied by the garment on the 3D user solid model, the forces being applied by the larger 3D user on the garment, or any combination.

Finite element analysis utilizes the actually known characteristics of the fabric or other material forming the garment or accessory, i.e., how it behaves in accordance with known engineering properties like stress, strain, deformation, reflection, twist, or turn. The fabric presets are not independent variables and further testing may be used to arrive at the final fabric preset.

Inputs to the finite elements analysis to determine the body/garment/location relationship (mathematical images/nurbs/solid models) include: (1) global center of assembly; (2) global center of garment/accessory component; (3) center of garment/accessory; (4) component shape/section; (5) global center of body component; (6) center of body component section/part; (7) axis and centers of rotation; (8) center, axis, and surface mates; and (9) gravitational forces acting on the garment/accessory.

The finite element analysis model then analyzes the finite element simulation results, interprets results, modifies areas of improper fit, replaces garments that do not meet users' expectations, reiterates all outputs and modified/new inputs to generate a new finite simulation, and makes transparency adjustments to selected fabric. The result of the finite element analysis is a masked and unmasked USGAL and a USGAL project/user group classification and description.

Having now fully set forth the preferred embodiments and certain modifications of the concept underlying the present invention, various other embodiments as well as certain variations and modifications of the embodiments herein shown and described will obviously occur to those skilled in the art upon becoming familiar with said underlying concept. It is to be understood, therefore, that the invention may be practiced otherwise than as specifically set forth in the appended claims.

We claim:

1. A method of generating a realistic image of an article of clothing as it would appear if fitted on a depiction of a user's body, comprising the steps of:
storing in a database management system a first data set comprising a plurality of data points defining a three-dimensional mathematical representation of a shape of said user's body collected from a three-dimensional scan of said user's body performed by a body scanner;
retrieving, by a virtual fitting room system, said first data;
retrieving, by said virtual fitting room system, a second data set containing a plurality of data points defining a three-dimensional shape of said article of clothing;
retrieving, by said virtual fitting room system, a fourth data set comprising a plurality of data points defining a three-dimensional shape of a space between said user's body and a standard garment when worn by said user;
applying, by said virtual fitting room system, a finite element analysis to said first, fourth and second data sets, said finite element analysis having as an output a third data set defining a shape of said article of clothing in combination with said three-dimensional mathematical representation of a shape of said user's body wearing said article of clothing;
generating, by said virtual fitting room system, an image of said shape of said article of clothing in combination with said three-dimensional mathematical representation of a shape of said user's body wearing said article of clothing as defined by said third data set; and
displaying said image to said user;
wherein said fourth data set comprises a plurality of data points collected from a comparison of said first data set and a fifth data set collected from a three-dimensional scan of said user's body wearing said standard garment.

2. The method of claim 1 wherein said first data set further comprises the mass of said user's body.

3. The method of claim 1 wherein said second data set further comprises at least one data point selected from the group including the dimensions, closure type, fabric type, material elasticity, material texture and material weight of said article of clothing.

4. The method of claim 1, further comprising
storing, via said database management system, a library of garment data sets, each said garment data set including a plurality of data points defining a three-dimensional shape of a garment and an image of said garment;
presenting, by said virtual fitting room system, via at least one remote computing device, one or more of said images of said garments in said library to said user;
wherein said second data set is identified for retrieval from said library by said virtual fitting room system by selection of one of said images presented to said user.

5. The method of claim 1, wherein said second data set is generated by said user.

6. The method of virtually fitting an article of clothing to an accurate three-dimensional depiction of a user's body of claim 5, further comprising:
transmitting, by said virtual fitting room system, said second data set via a communications network to a third party.

7. The method of claim 6, wherein said third party is selected from the group comprising a clothing designer, a clothing manufacturer, a clothing distributor, and a clothing retailer.

8. The method of claim 1, further comprising:
storing, by said database management system, a plurality of user data sets each comprising a plurality of data points defining a three-dimensional mathematical representation of a shape of a user's body collected from a three-dimensional scan of each user's body;

selecting, by said virtual fitting room system, from at least a portion of said plurality of user data sets data points representing a shape of a portion of said user's body; and storing said selected data points in at least one data set specific to said feature of the human body.

9. The method of claim 8, wherein said at least one data set specific to said feature of the human body comprises a plurality of data sets specific to said feature of the human body into which said user's data points are sorted based on one or more criteria selected from the group comprising income of said people, geographic location of said people, state of residence of said people, waist measurement of said people, gender of said people, and browsing history of said people.

10. The method of claim 1, further comprising:

retrieving, by said virtual fitting room system, a sixth data set comprising a plurality of data points describing a location profile; and wherein said step of generating, by said virtual fitting room system, an image of said shape of said article of clothing in combination with said three-dimensional mathematical representation of a shape of said user's body wearing said article of clothing further comprises locating said shape of said article of clothing in combination with said three-dimensional mathematical representation of a shape of said user's body wearing said article of clothing at said location in said image.

11. The method of claim 10, wherein said location profile comprises a three-dimensional image selected by said user.

* * * * *